US010727788B2

(12) United States Patent
Petrovic et al.

(10) Patent No.: US 10,727,788 B2
(45) Date of Patent: Jul. 28, 2020

(54) DIGITAL DYNAMIC BIAS CIRCUIT

(71) Applicant: VIASAT, INC., Carlsbad, CA (US)

(72) Inventors: Branislav A Petrovic, Falls Church, VA (US); Kenneth V Buer, Gilbert, AZ (US); Kenneth P Brewer, Mesa, AZ (US); Steve L Kent, Chandler, AZ (US); Sateh Jalaleddine, Phoenix, AZ (US)

(73) Assignee: VIASAT, INC., Carlsbad, CA (US)

( * ) Notice: Subject to any disclaimer, the term of this patent is extended or adjusted under 35 U.S.C. 154(b) by 0 days.

(21) Appl. No.: 15/752,172

(22) PCT Filed: Aug. 12, 2016

(86) PCT No.: PCT/US2016/046715
§ 371 (c)(1),
(2) Date: Feb. 12, 2018

(87) PCT Pub. No.: WO2017/030935
PCT Pub. Date: Feb. 23, 2017

(65) Prior Publication Data
US 2018/0241347 A1 Aug. 23, 2018

Related U.S. Application Data

(60) Provisional application No. 62/205,286, filed on Aug. 14, 2015.

(51) Int. Cl.
*H03F 1/02* (2006.01)
*H03F 3/19* (2006.01)
(Continued)

(52) U.S. Cl.
CPC ............... *H03F 1/02* (2013.01); *H03F 1/025* (2013.01); *H03F 1/0227* (2013.01);
(Continued)

(58) Field of Classification Search
CPC ........ H03F 1/0222; H03F 1/32; H03F 1/0266; H03F 1/3205; H03F 2200/18;
(Continued)

(56) References Cited

U.S. PATENT DOCUMENTS 5,559,807 A 9/1996 Van Den Heuvel et al.
6,246,286 B1 6/2001 Persson
(Continued)

FOREIGN PATENT DOCUMENTS

CN 1325181 A 12/2001
GB 2398648 A 8/2004
(Continued)

OTHER PUBLICATIONS

Adel A. M. Saleh and Donald C. Cox, "Improving the Power-Added Efficiency of FET Amplifiers Operating with Varying-Envelope Signals", Bell Laboratories, IEEE (Year: 1983).*
(Continued)

*Primary Examiner* — Aristocratis Fotakis
(74) *Attorney, Agent, or Firm* — Chang & Hale LLP

(57) ABSTRACT

Circuits and methods for reducing the cost and/or power consumption of a user terminal and/or the gateway of a telecommunications system (550) that may include a telecommunications satellite. Embodiments generate a dynamic input bias signal based upon an information signal envelope (which may be pre-distorted) which is applied to the signal input of a power amplifier (PA), thus reducing average power consumption. Other embodiments further include dynamic linearization (518) of the information signal, and/or variation of the supply voltage to the power amplifier (PA) as a function of the envelope of the information signal. Another aspect is a multi-stage "chained" feedback regu-
(Continued)

lated voltage supply circuit for providing two or more output voltages that may be used as alternative supply voltages to a power amplifier (PA).

32 Claims, 8 Drawing Sheets

(51) Int. Cl.
| | |
|---|---|
| H03F 3/24 | (2006.01) |
| H03F 1/32 | (2006.01) |
| H04B 1/04 | (2006.01) |
| H04B 1/713 | (2011.01) |
| H04L 27/38 | (2006.01) |
| H04L 27/233 | (2006.01) |
| H04B 17/13 | (2015.01) |
| H02M 3/158 | (2006.01) |

(52) U.S. Cl.
CPC ......... *H03F 1/0266* (2013.01); *H03F 1/3241* (2013.01); *H03F 3/19* (2013.01); *H03F 3/24* (2013.01); *H03F 3/245* (2013.01); *H04B 1/0475* (2013.01); *H04B 17/13* (2015.01); *H04L 27/2332* (2013.01); *H04L 27/3809* (2013.01); *H02M 3/158* (2013.01); *H03F 2200/102* (2013.01); *H03F 2200/336* (2013.01); *H03F 2200/435* (2013.01); *H03F 2200/451* (2013.01); *H03F 2200/511* (2013.01); *H03F 2201/3215* (2013.01); *H04B 2001/045* (2013.01)

(58) Field of Classification Search
CPC ............. H03F 2200/15; H03F 2200/24; H03F 2200/522; H03F 2200/102; H03F 1/304; H03F 2200/451
See application file for complete search history.

(56) References Cited

U.S. PATENT DOCUMENTS

| | | | |
|---|---|---|---|
| 6,351,189 B1* | 2/2002 | Hirvilampi | H03F 1/0261 330/296 |
| 6,593,812 B2 | 7/2003 | Sundström | |
| 6,734,729 B1 | 5/2004 | Andrys et al. | |
| 6,937,094 B2 | 8/2005 | Khanifar et al. | |
| 7,088,958 B2 | 8/2006 | MacFarlane Shearer, III et al. | |
| 7,113,037 B2 | 9/2006 | Nezami | |
| 7,477,102 B1 | 1/2009 | Ellis et al. | |
| 7,564,311 B2 | 7/2009 | Rohani et al. | |
| 7,602,244 B1 | 10/2009 | Holmes et al. | |
| 7,729,672 B2 | 6/2010 | Deng et al. | |
| 8,054,126 B2 | 11/2011 | Yang et al. | |
| 8,706,062 B1 | 4/2014 | Yu et al. | |
| 8,779,851 B2 | 7/2014 | Anvari | |
| 8,908,751 B2 | 12/2014 | Camuffo et al. | |
| 9,020,454 B2 | 4/2015 | Waheed et al. | |
| 2003/0107412 A1* | 6/2003 | Melsa | H03F 1/025 327/108 |
| 2003/0112068 A1* | 6/2003 | Kenington | H03F 1/0261 330/136 |
| 2005/0152471 A1* | 7/2005 | Tanaka | H03F 1/0205 375/295 |
| 2007/0281635 A1* | 12/2007 | McCallister | H03C 5/00 455/126 |
| 2009/0227215 A1 | 9/2009 | McCallister | |
| 2009/0295485 A1 | 12/2009 | Mitchell | |
| 2011/0050345 A1* | 3/2011 | Quack | H03F 1/0266 330/277 |
| 2011/0098011 A1* | 4/2011 | Camp, Jr. | H03F 1/0222 455/114.3 |
| 2012/0056678 A1* | 3/2012 | Wang | H03F 1/0266 330/296 |
| 2012/0108187 A1* | 5/2012 | Kitamura | H03F 1/0261 455/110 |
| 2012/0328050 A1 | 12/2012 | Bai et al. | |
| 2014/0312974 A1* | 10/2014 | Khesbak | H03G 3/3042 330/279 |
| 2014/0355714 A1 | 12/2014 | Cheng et al. | |
| 2015/0049822 A1* | 2/2015 | Schemmann | H04B 3/10 375/257 |
| 2015/0085902 A1* | 3/2015 | Butterfield | H03M 1/1245 375/219 |
| 2015/0145596 A1* | 5/2015 | Fagg | H03F 1/0266 330/258 |
| 2015/0162882 A1 | 6/2015 | Tam et al. | |
| 2015/0365114 A1* | 12/2015 | Axholt | H04B 1/0475 455/114.3 |
| 2016/0036386 A1 | 2/2016 | Morshedi et al. | |
| 2016/0072530 A1* | 3/2016 | El-Hassan | H03F 1/0227 455/114.2 |
| 2016/0099732 A1* | 4/2016 | Petrovic | H04B 1/0475 375/297 |
| 2016/0211804 A1* | 7/2016 | Liao | H03F 1/0205 |
| 2019/0245085 A1* | 8/2019 | Achiriloaie | H03F 3/193 |

FOREIGN PATENT DOCUMENTS

| | | |
|---|---|---|
| WO | WO-2014/036143 A1 | 3/2014 |
| WO | WO-2017/030935 A1 | 2/2017 |

OTHER PUBLICATIONS

Agilent Technologies, "Envelope Tracking and Digital Pre-Distortion Power Amplifier Testing for LTE User Terminal Components", Application Note, www.agilient.com, Mar. 7, 2014, 12 pgs.
Balasubramanian et al., "Pre-Distortion Techniques and Bandwidth Efficient Modulation for Military Satellite Communications", IEEE, Military Communications Conference, Oct. 31-Nov. 3, 2004, 6 pgs.
Chen, "Wideband Dynamic Biasing of Power Amplifiers for Wireless Handheld Applications", https://smartech.gatech.edu/bitstream/handle/1853/11554/chen_jau-horng_200608_phd.pdf, Doctoral Dissertation, Georgia Institute of Technology, Aug. 2006, 129 pgs.
EE Times Asia, "Power Amp Biasing with Digital Dynamic Bias Chip", http://www.eetasia.com/ARTICLES/2005NOV/B/2005NOV01_ACC_POW_TA.pdf?SOURCES=DOWNLOAD, Nov. 1, 2005, 3 pgs.
Hsu et al., "Digital in-situ biasing technique", Electronic Letters, vol. 51, No. 12, Jun. 11, 2015, pp. 897-899.
IMS Student Design Competition, "Power Amplifier Linearization through Digital Predistortion (DPD)", http://dpdcompetition.com/about/#, Oct. 14, 2015, 2 pgs.
Lanuzza et al., "Dynamic Gate-level Body Biasing for Subthreshold Digital Design", 2014 IEEE 5th Latin American Symposium on Circuits and Systems (LASCAS), Feb. 25-28, 2014, 4 pgs.
Sperlich et al., "Closed-Loop Digital Pre-Distortion for Power Amplifier Linearization using Genetic Algorithms", 2003 IEEE MTT-S International Microwave Symposium Digest (vol. 1), Jun. 8-13, 2003, pp. 347-350.
International Search Report and Written Opinion mailed in International (PCT) Application No. PCT/US2016/046715 dated Jan. 12, 2017, 18 pgs.
International Preliminary Report on Patentability mailed in International (PCT) Application No. PCT/US2016/046715 dated Mar. 1, 2018, 13 pgs.
Examination Report No. 1, IP Australia, dated Dec. 9, 2019, in 5 pages.

* cited by examiner

DIGITAL DYNAMIC BIAS CIRCUIT

CROSS-REFERENCE TO RELATED APPLICATION

This patent application claims the benefit of priority under 35 U.S.C. § 119(e) to commonly-assigned U.S. Provisional Patent Application No. 62/205,286, filed Aug. 14, 2015, entitled "Long Loop Dynamic Bias of Power Amplifiers", which is hereby incorporated by reference herein as if set forth in full.

BACKGROUND

(1) Technical Field

This invention relates to electronic circuits, and more particularly to bias and linearization circuitry for power amplifiers.

(2) Background

FIG. 1 is a block diagram of a prior art telecommunications system 100. A user terminal 102 is coupled to a user antenna 104; the user terminal 102 optionally may be divided between an indoor component (e.g., at least one transceiver and local connection circuitry) and an outdoor component (e.g., at least one low noise amplifier). Similarly, a gateway 106 including at least one transceiver is coupled to a gateway antenna 108, and may be connected to one or more information nodes 110. The gateway 106 generally will include one or more processing nodes that provide a variety of signal processing functions to establish and maintain communication channels with one or more user terminals 102. Signals may be communicated between the user terminal 102 and the gateway 106 through their respective antennas 104, 108 across a communications network 110, which in some applications may include a telecommunications satellite 112.

Examples of applications for the illustrated telecommunications system 100 include satellite television, wireless network systems (e.g., WiFi), and cellular or mobile telephone systems. Accordingly, the telecommunications system 100 typically will include a plurality of user terminals 102, and the information nodes 110 may include the Internet, and/or private connections to multimedia content providers (e.g., television programs, movies, computer games, etc.), and/or other users (e.g., other subscribers in a wireless telephone system).

For many applications, particularly satellite television and wireless telephone systems, it is useful to reduce the cost and/or power consumption of the user terminal 102 (e.g., a satellite TV terminal or a cell phone) and/or of the gateway 106. An aspect of the present invention is to do one or both of the foregoing.

SUMMARY

An aspect of the present invention is to reduce the cost and/or power consumption of a user terminal and/or the gateway of a telecommunications system while meeting desired performance specifications. Embodiments generate a dynamic input bias signal based upon an information signal envelope (which may be pre-distorted) which is applied to the signal input of a power amplifier, thus reducing average power consumption. Other embodiments further include dynamic linearization of the information signal, and/or variation of the supply voltage to the power amplifier as a function of the envelope of the information signal. Another aspect is a multi-stage "chained" feedback regulated voltage supply circuit for providing two or more output voltages that may be used as alternative supply voltages to the power amplifier.

More specifically, in one embodiment, source information in digital form is coupled to a digital modulator that generates intermediate I and Q data streams. The digital modulator also outputs a combined modulated information signal that is coupled to a digital-to-analog (DAC) circuit which outputs an analog signal. The analog signal output from the DAC is coupled to an adder, the output of which in turn is coupled to the signal input of a power amplifier (PA). The output of the PA is the signal applied to and transmitted by an antenna. The intermediate I and Q data streams from the digital modulator are also coupled to an envelope computation block, which generates an envelope E of the source information signal. The envelope E of most modulated information signals exhibits peaks and valleys as the modulated information signal varies over time, but most of the time the envelope stays around an average level that is significantly lower than the peak level.

The output of the envelope computation block may be used as an undistorted dynamic input bias signal, which may be converted to an analog signal by a DAC and combined in the adder with the analog signal derived from the modulated information signal. The undistorted dynamic input bias signal and modulated information signal may be applied at the input of the PA and change (modulate) the current through the PA as a function of the envelope of the modulated information signal.

For a number of power amplifier designs, when the input signal level is changed, the gain of the amplifier changes as well, which is an undesired effect that generally causes distortion. Accordingly, in some embodiments of the invention, it is useful to modify the dynamic input bias signal by passing the envelope signal through a pre-distortion block before applying the combination of the dynamic input bias signal and the information signal to the signal input of the PA. Such pre-distortion is performed in a way that dynamically counteracts the input signal level-dependent gain variations within the PA, and thus reduces or even eliminate changes to the gain of the PA in conjunction with optimizing performance and power consumption of the PA. More particularly, as the undistorted dynamic input bias signal changes, the pre-distorted dynamic input bias signal to the PA is changed in a complementary way to cancel the amplifier's gain change. In some embodiments, the envelope E is pre-distorted by multiplying the data representing the envelope E with an inverse profile of the gain of the PA.

In some applications, there may be some residual distortion in the combined signal that is applied to the signal input of a power amplifier. Such residual distortion, if any, can be reduced by additional correction (pre-distortion) in the information signal path, separate from the envelope signal path. Accordingly, an optional linearization block may be included in the information signal path. Linearization is essentially a form of pre-distortion that modifies an information signal to counteract the non-linear characteristics of a typical power amplifier. Embodiments of the invention that include an optional linearization block may take advantage of the existing receiver within a user terminal—normally used for duplex data communications—to off-load the process of computing linearization calibration data from the user terminal to one or more processing nodes in a gateway.

Such a calibration/linearization process is a closed loop system, albeit with a "long" loop through an interconnecting communications network.

Another aspect of the invention includes both pre-distorted dynamic input biasing—which effectively biases the supply current through a power amplifier as a function of the envelope E—and biasing of the supply voltage to the power amplifier as a function of the occurrence of peaks in the envelope E. Biasing both supply current and supply voltage can result in a significant reduction in power consumption in the PA. In embodiments of the invention with dual biasing, the supply current bias is fast, tracking at the full information signal envelope rate, while the supply voltage bias is slower, tracking at a lower speed only the peaks of the envelope that exceed some threshold or meet some specified criteria. This behavior may be achieved by digital processing, including computing the envelope E and deciding which peaks to track and which ones to partially track or not track at all, as described in further detail below. Increasing the supply voltage to a PA only for peaks above a specified threshold will generally only be required at a rate that can be met by the supply voltage source.

Embodiments of the invention with dual biasing require at least two regulated voltage levels for the power amplifier. Disclosed is a "chained" feedback-regulated voltage supply circuit that eliminates the need for separate regulator circuits for each regulated voltage. In one embodiment, a voltage supply circuit automatically maintains a substantially constant voltage V1 at a first node for a first load, and a substantially constant voltage V2 at a second node for a second load, both under regulated by a single controller.

Embodiments of the invention may be used in conjunction with radio frequency (RF), optical, and/or wireline (e.g., cable, digital subscriber line, etc.) telecommunications systems.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

An aspect of the present invention is to reduce the cost and/or power consumption of a user terminal and/or the gateway of a telecommunications system while meeting desired performance specifications. Embodiments generate a dynamic input bias signal based upon an information signal envelope (which may be pre-distorted) which is applied to the signal input of a power amplifier, thus reducing average power consumption. Other embodiments further include dynamic linearization of the information signal, and/or variation of the supply voltage to the power amplifier as a function of the envelope of the information signal. Another aspect is a multi-stage "chained" feedback regulated voltage supply circuit for providing two or more output voltages that may be used as alternative supply voltages to the power amplifier. Another aspect of the invention is to move processing (e.g., computing software and/or hardware) from user terminals to one or more "remote nodes" that may be, for example, processing nodes of a gateway.

Embodiments of the invention may be used in conjunction with a wide variety of telecommunications systems, including radio frequency (RF), wireline (e.g., cable, digital subscriber line, etc.), optical, etc. For simplicity, the examples below will be described in the context of an RF telecommunications system, with the understanding that the invention is not limited to such systems.

Example RF Telecommunications System

Figure 2:
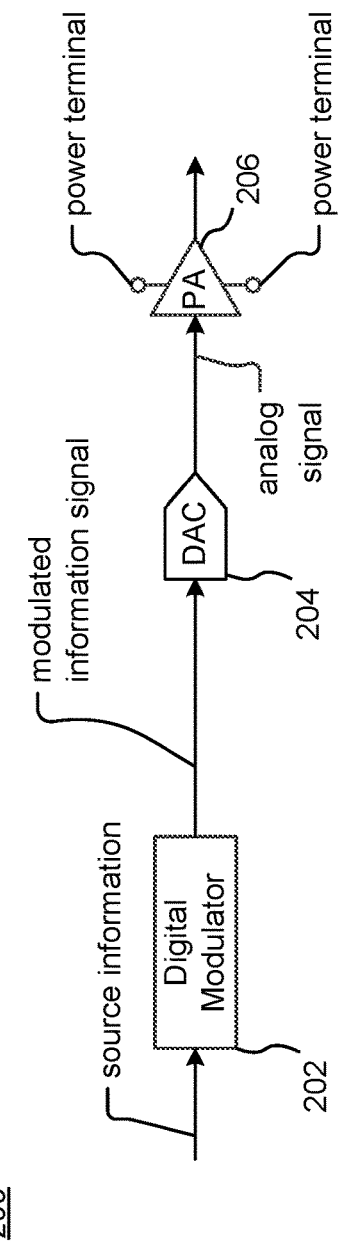
FIG. 2 is a block diagram of a simplified RF transmitter for transmitting an RF signal derived from a digital source.

In an RF telecommunications system having an RF transmitter, an important component of the RF transmitter is a power amplifier. FIG. 2 is a block diagram of a simplified RF transmitter 200 for transmitting an RF signal derived from digital source information. Digital source information is coupled to a digital modulator 202 which provides a modulated information signal. The modulated information signal is coupled to a digital-to-analog (DAC) circuit 204 that outputs an analog signal. The analog signal is coupled to the signal input of a power amplifier (PA) 206, either directly or after up-conversion to another frequency.

Internally, the PA 206 will often include one or more amplification stages that include one or more power field effect transistors (FETs) each having gate, source, and drain terminals (noting that some designs may include shared drains and sources, and/or have shared gates across two or more FETs, or multiple gates per FET). The FETs may be fabricated using any of a number of technologies, including gallium arsenide (GaAs), gallium nitride (GaN), standard bulk silicon, silicon-on-insulator (SOI), silicon-on-sapphire (SOS), and MESFET technologies. However, the invention is not limited to FETs or to GaAs or GaN fabrication technologies, and may include, for example, junction FETs, other insulated gate FET (IGFET) types (e.g., MOSFETs), or bipolar junction transistors (BJTs), the latter having base, emitter, and collector terminals.

A PA 206 is configured to receive a signal input, which is applied to the base or gate of one or more power transistors which amplify the signal input for transmission. The signal input may be directly connected to a power transistor input, or indirectly coupled to a power transistor input through coupling circuitry (such as a series capacitor) and/or buffering or level shifting circuitry (not shown for simplicity). The PA 206 also includes power terminals, which are commonly a DC voltage (e.g., $V_{DD}$ for FETs, $V_{CC}$ for BJTs) and DC ground (which is often also the RF circuit ground). A PA 206 may include additional circuitry, such as drivers and/or pre-amplifiers, that help perform the amplification function for particular applications.

Figure 3:
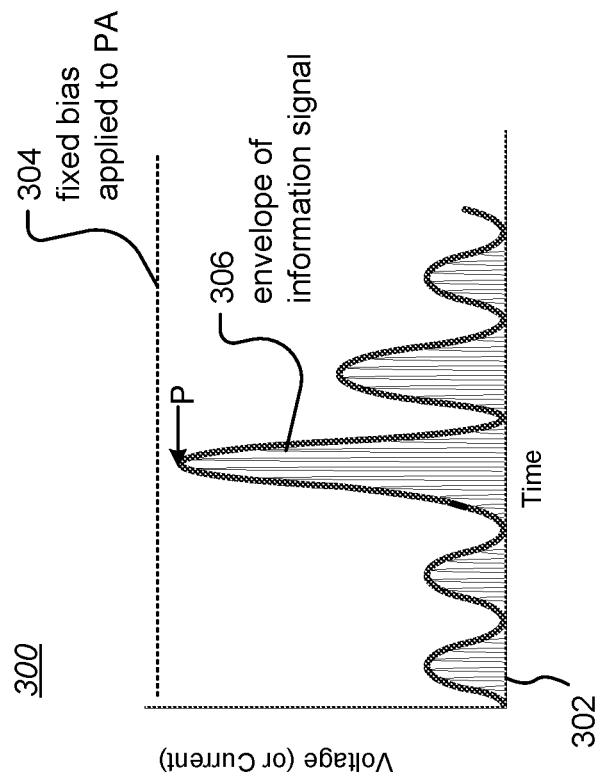
FIG. 3 is graph of an example prior art information signal having varying voltage (or current) over time in a transmitter having a power amplifier with a fixed input bias signal.

A fixed input bias signal may be applied as the signal input to a PA 206 to bias the input (e.g., gate or base) of at least one power transistor to establish a desired operating condition for the PA. However, a power amplifier having a fixed input bias signal generally wastes power, since a fixed signal input bias causes the PA 206 to constantly draw power through its power terminals. For example, FIG. 3 is graph 300 of an example prior art information signal 302 having varying voltage (or current) over time in a transmitter having a power amplifier with a fixed input bias signal (for clarity, only the positive half of the information signal 302 waveform is shown). Note that FIG. 3 is intended to show the power of the modulated RF signal (in terms of voltage or current in a PA) over time, and not a modulation technique per se; the information signal 302 may be modulated using a number of techniques, such as amplitude modulation, frequency modulation, phase modulation, or combinations of those methods and other modulation techniques that are particularly useful for transmitting digital data, such as quadrature amplitude modulation (QAM), phase shift keying (PSK), orthogonal frequency-division multiplexing (OFDM), etc.

A dashed line 304 in FIG. 3 shows the level of the fixed input bias signal applied to a PA. The power consumed by the PA is proportional to the area under the dashed bias line 304. However, the power level of the information signal 302 is defined by an envelope 306 curve. In this example, the power level of the information signal 302 stays relatively low most of the time, and goes to peak power at point P only once. Since the PA in this example is biased to deliver the highest efficiency only at peak power, excess power is wasted for all signals having power levels less than that peak. Wasted power causes a number of consequences, including: shorter battery life or a larger battery capacity requirement (with a concomitant adverse impact on the size of a user terminal 102); generated heat, generally requiring thermal management (e.g., larger fans, heat sinks, etc.); more robust electronic components to handle the highest possible power output, rather than an average power output with short excursions at higher power; and shortened lifetime for electronic components.

Dynamic Biasing

Figure 4:
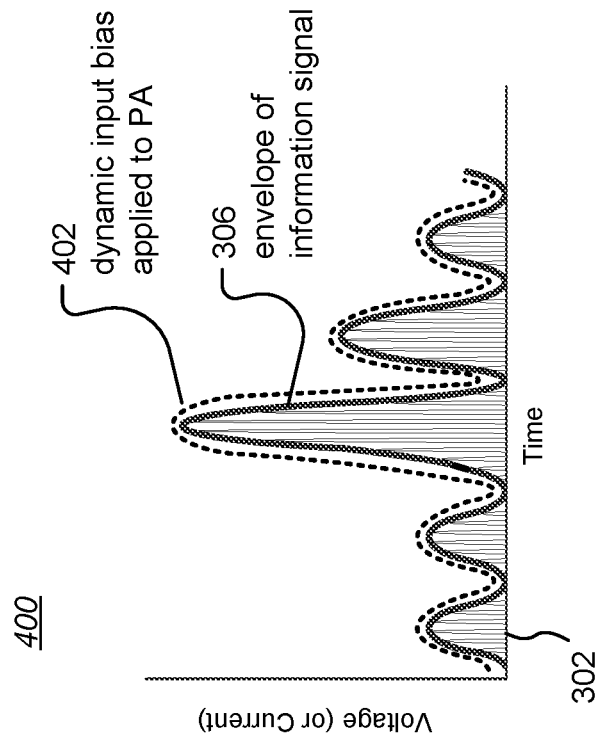
FIG. 4 is graph of an information signal having varying voltage (or current) over time in a transmitter having a power amplifier with a dynamic input bias signal.

Embodiments of the invention provide an improved approach to controlling biasing of the current or voltage applied to a PA. FIG. 4 is graph 400 of an information signal 302 having varying voltage (or current) over time in a transmitter having a power amplifier with a dynamic input bias signal. As described below, some embodiments of the invention track the envelope 306 of the information signal 302 and generate a dynamic input bias signal 402 to a PA that provides sufficient bias to the signal input of the PA to amplify the information signal 302 without wasting a significant amount of power. The power consumed by the PA is proportional to the area under the dynamic input bias signal 402 (dashed curve). Other embodiments described below generate a dynamic input bias signal 402 to the PA that provides sufficient bias to the PA for most information signal 302 power levels, but does not always closely track the envelope 306 for higher powered signal excursions, resulting in an even lower average dynamic input bias signal to the PA.

Envelope Detection & Dynamic Input Bias Generation

Figure 5:
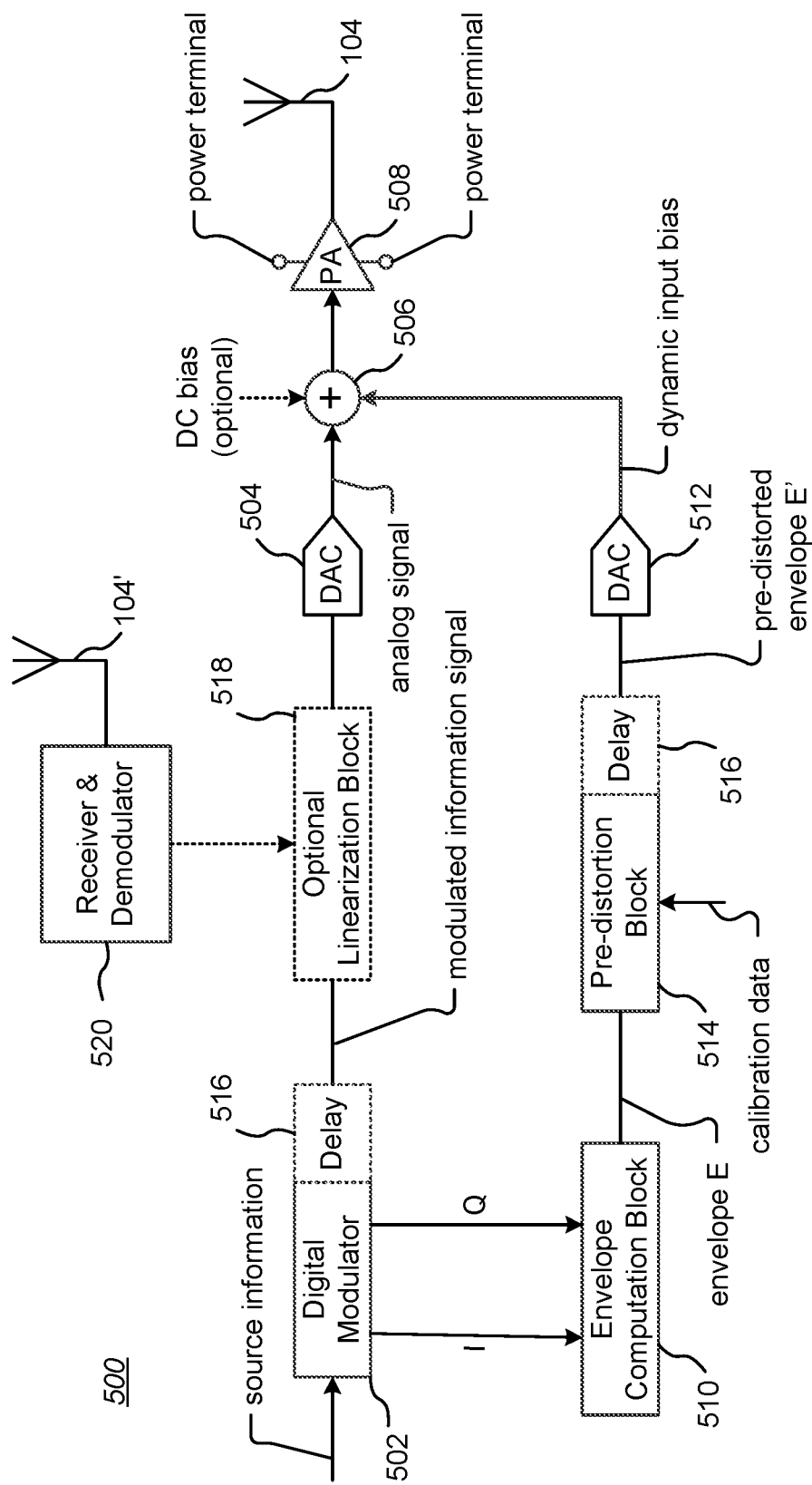
FIG. 5 is a block diagram of one embodiment of an RF transmitter that tracks the envelope of an information signal and generates a dynamic input bias signal to a PA.

FIG. 5 is a block diagram of one embodiment of an RF transmitter 500 that tracks the envelope of an information signal and generates a dynamic input bias signal to a PA. Such an RF transmitter 500 may be, for example, a component of a user terminal 102. This particular example embodiment is useful in RF transmission systems that utilize some form of "IQ modulation", where "I" is the "In-phase" component of a signal waveform, and "Q" is the "Quadrature" component of the signal waveform, 90° out of phase with respect to the I component. Examples of IQ modulation-based systems include QAM and PSK transmission systems.

Figure 1:
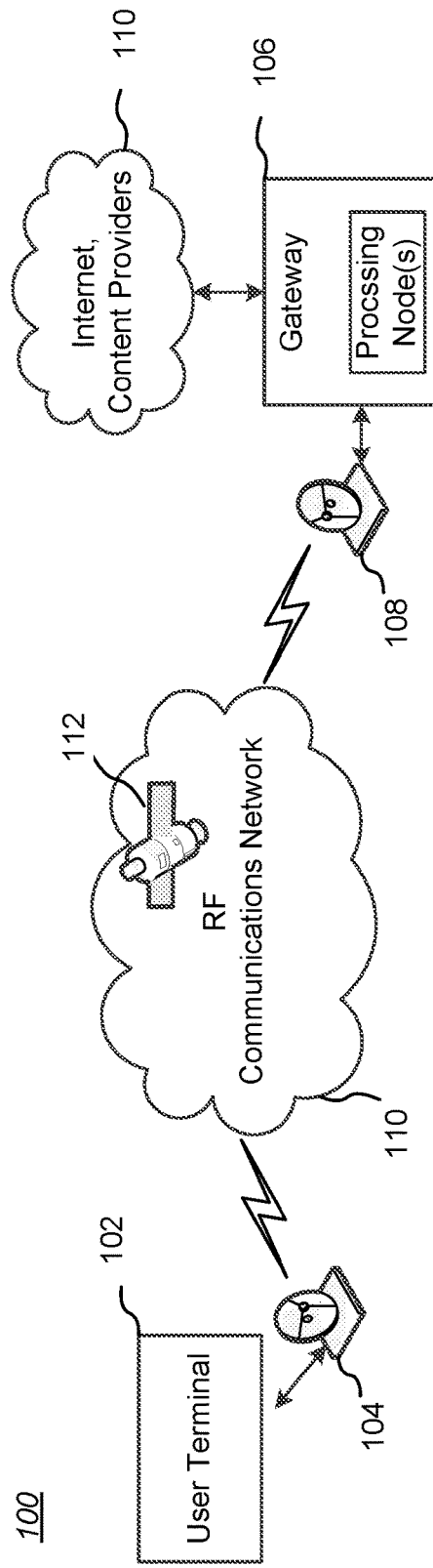
FIG. 1 is a block diagram of a prior art telecommunications system.

In FIG. 5, source information in digital form is coupled to a digital modulator 502 that generates intermediate I and Q data streams in known fashion. In this example, the digital modulator 502 also outputs a combined modulated information signal generated from the intermediate I and Q data streams. The modulated information signal is coupled to a digital-to-analog (DAC) circuit 504, which outputs an analog signal. The analog signal output from the DAC 504 is coupled to an adder 506, the output of which in turn is coupled to the signal input of a power amplifier (PA) 508. The output of the PA 508 is the signal applied to and transmitted by an antenna (e.g., user antenna 104 in FIG. 1). In some embodiments, the modulated information signal may be up-converted to another frequency, in known fashion, before or after the DAC 504.

As illustrated, the intermediate I and Q data streams from the digital modulator 502 are also coupled to an envelope computation block 510, which generates an envelope E of the source information signal. For systems having intermediate I and Q data streams, one convenient way of computing the envelop E is to apply the following formula:

$$E=\sqrt{I^2+Q^2} \qquad \text{EQ. 1}$$

Alternatively, particularly for RF transmitters that do not utilize IQ modulation (e.g., AM, FM, or PM based transmitters), the envelop E of a source information signal may be determined in a number of known ways. The envelope E of most modulated information signals exhibits peaks and valleys as the modulated information signal varies over time, but most of the time the envelope stays around an average level that is significantly lower than the peak level.

The output of the envelope computation block 510 may be used as an undistorted dynamic input bias signal, which may be converted to an analog signal by a DAC 512 and combined in the adder 506 with the analog signal derived from the modulated information signal. The undistorted dynamic input bias signal and modulated information signal may be applied at the input of the PA 508 and change (modulate) the current through the PA 508 (e.g., the output drain current $I_{DD}$ of a FET or the collector current Icc current of a BJT) as a function of the envelope of the modulated information signal. More specifically, if the PA signal input is ultimately coupled to the gate of a FET, the gate voltage to the FET is dynamically biased, and if the PA signal input is ultimately coupled to the base of a BJT, the base current to the BJT is dynamically biased.

In some embodiments, the analog input bias signal and the analog information signal may be directly combined in the adder 506. In other embodiments, the carrier frequency of the information signal may be much higher than the frequency of the envelope (e.g., a carrier at 30 GHz, and an envelope at 3 GHz), and accordingly the modulated carrier signal and the envelope input bias signal may be combined via a suitable circuit such as a diplexing network.

In some embodiments, an analog RF information signal is directly synthesized with a DAC (no up-converters are used). In such embodiments, one of the two DACs 504, 512 may be eliminated and their functions combined in a single DAC by digitally combining the modulated information signal and the pre-distorted envelope signal. The single DAC can then convert the combined digital data stream to analog form and the composite analog signal may then be applied to the signal input of the PA 508, thus accomplishing the same function as with two DACs 504, 512. Accordingly, the functions of the DACs 504, 512 and adder 506 may be generally regarded as a "combining and conversion" circuit that may be implemented in a number of ways that should be clear to one of ordinary skill in the art.

In the above example, the dynamic input bias signal was essentially the envelope E as computed in EQ. 1. However, the dynamic input bias signal (which may also be referred to as an "envelope-derived" signal) instead may be proportional to the envelope, or to the envelope squared, or to some other function of the envelope, including in combination with additive offsets, multiplying coefficients, etc., depending on the type of power amplifier and the nonlinearity being linearized.

Since the envelope E tracks the information signal, the stronger the information signal, the higher the envelope, and thus the higher the dynamic input bias signal. Conversely, the lower the information signal, the lower the envelope, and thus the lower the dynamic input bias signal. For example, a phase-modulated satellite signal, such as 16 PSK, may have a 6 dB (or 4 times) peak-to-average power ratio. Theoretically, power consumption in the PA 508 could be reduced by the same factor by dynamically biasing the supply current ($I_{DD}$ or $I_{CC}$) of the PA by applying the dynamic input bias signal, and by biasing the supply voltage ($V_{DD}$ or $V_{CC}$) as a function of the envelope E (see the description of supply voltage biasing below). Modulating only the supply current or the supply voltage can yield half as much improvement; with QAM or OFDM modulation, which have higher peak power, even greater improvements are possible.

Accordingly, compared with a fixed input bias which would cause continuous high current through the PA 508, the average current through the PA 508 is reduced by applying a dynamic input bias signal, thus reducing overall power consumption. Less power consumption results in less heat, longer battery life or a smaller battery capacity (with a concomitant beneficial impact on the size of a user terminal), and a longer lifetime for the electronic components. In some embodiments, the same dynamic input bias signal (or a scaled version of that signal) may be applied to other amplifier stages or amplifier elements, such as preamplifiers or PA drivers ahead of a final PA stage, for even greater power savings.

Pre-Distortion of Envelope

For a number of power amplifier designs, when the input signal level is changed, the gain of the amplifier changes as well, which in some applications can be an undesired effect that generally causes distortion. For example, the gain of a particular PA may be (1) expansive (i.e., increasing with increasing signal level) when input signal levels are low, (2) reach a peak with medium input signal levels, and (3) compressive (i.e., decreasing with increasing input signal levels) when input signal levels are high.

Accordingly, in some embodiments of the invention, it is useful to apply a transform function to modify the dynamic input bias signal by passing the envelope signal through a pre-distortion block 514 before applying the combination of the dynamic input bias signal and the information signal to the signal input of the PA 508. Such pre-distortion is performed in a way that dynamically counteracts the input signal level-dependent gain variations within the PA 508, and thus reduces or even eliminate changes to the gain of the PA 508 in conjunction with optimizing performance and power consumption of the PA 508.

More particularly, as the undistorted dynamic input bias signal changes, the pre-distorted dynamic input bias signal to the PA 508 is changed in a complementary way to cancel the amplifier's gain change. Thus, for example, if the gain of the PA 508 drops by 1 dB when the input signal bias is reduced, the dynamic input bias signal is increased by the same amount of 1 dB to maintain a constant gain in the PA 508, thus not degrading linearity.

Accordingly, in some embodiments, the envelope E is pre-distorted by multiplying the data representing the envelope E with a transform function comprising an inverse profile of the gain of the PA 508. The gain profile may be expressed as a polynomial with coefficients, and computed inverse polynomial coefficients may be applied by the pre-distortion block 514 to transform the envelope E to a pre-distorted envelope E'. For example, power-in versus power-out data for the gain of the PA 508 may be determined, and the resulting data mapped to a polynomial of the following form (noting that higher order polynomials may be used if needed or desired):

$$y=ax+bx^2cx^3 \qquad \text{EQ. 2}$$

Once coefficients of the polynomial in EQ. 2 are fitted to the graph of the power-in versus power-out data, a correction transform function polynomial with (mostly) negative coefficients may be constructed, as follows:

$$y=ax-bx^2-cx^3 \qquad \text{EQ. 3}$$

Figure 6:
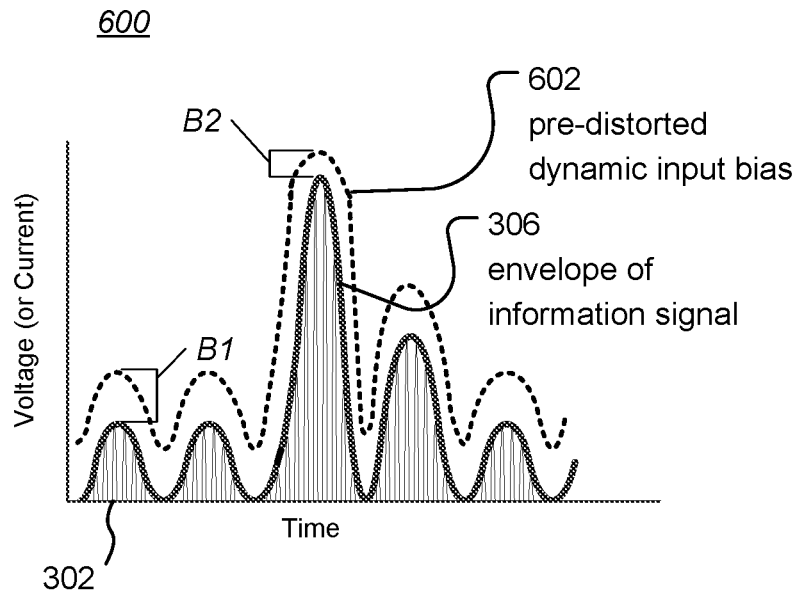
FIG. 6 is a graph of an information signal having varying voltage (or current) over time in a transmitter having a power amplifier with a pre-distorted dynamic input bias signal.

The pre-distortion block 514 applies the correction polynomial—such as by multiplication—to transform the envelope E to a pre-distorted envelope E'. The pre-distorted envelope E' can increase the gain of the PA 508 when the level of the envelope E is low (i.e., the gain is in an expansive state), and decrease the gain of the PA 508 when the level of the envelope E is high (i.e., the gain is in a compressive state). For example, FIG. 6 is a graph 600 of an information signal having varying voltage (or current) over time in a transmitter having a power amplifier with a pre-distorted dynamic input bias signal 602. As shown in this example, the pre-distorted dynamic input bias signal 602 has a higher relative bias level B1 for lower levels of the envelope 306, and a lower relative bias level B2 for higher levels of the envelope 306.

Calibration of the Pre-Distortion Block

The power amplifier gain profile and corresponding polynomial coefficients may be obtained by calibration, and the calibration data may be transmitted or otherwise supplied to the pre-distortion distortion block 514, as shown in FIG. 5. Such calibration data may be determined in a number of ways, including: determining the coefficients by analysis of the circuit design or by circuit modeling, optionally including statistical characterization, and programming/storing the coefficients locally (e.g., in the pre-distortion block 514) (an open-loop method); making measurements of transmitter characteristics during production and programming/storing the coefficients locally (another open-loop method); making measurements of transmitter characteristics via local detection of the output of the PA 508 and feeding back corresponding calibration data to the pre-distortion block 514 (a local closed-loop method); or making measurements of transmitter characteristics via remote monitoring of the output of the PA 508 (such as at a gateway 106) and transmitting back corresponding calibration data to the pre-distortion block 514 (a remote "long" closed-loop).

Embodiments of the invention that utilize a "long" closed-loop calibration methodology may take advantage of the existing receiver within a user terminal 102—normally used for duplex data communications—to off-load the process of computing pre-distortion calibration data from the user terminal 102 to one or more processing nodes in a gateway 106. Accordingly, a test signal may be transmitted through the PA 508, some performance metric may then be measured at the gateway 106, corresponding calibration data may then be computed at the gateway 106, and then the calibration data may be transmitted back to the receiver within a user terminal 102 where it is coupled to the pre-distortion block 514 (see also the discussion below regarding correction of residual distortion).

The measurement performance metrics and the signals used for calibration may include one or more of the following: outputting a single tone as a test signal, with measurement of gain and phase, including gain and phase compression and harmonics; a single tone level sweep test signal; a two-tone test signal, measuring the intermodulation and out-of-channel power (e.g., adjacent channel power, or ACP; in some embodiments, the modulation rate may be reduced so that the adjacent channel frequency falls inside the test channel, not outside of the channel, to prevent invasion and interference with the actual adjacent channel service); a multi-tone test signal, testing intermodulation and ACP; outputting a modulation signal (e.g., 8 PSK) that is used for normal communications, and measuring one or more of power level, signal-to-noise (SNR) ratio, error vector magnitude (EVM), bit error rate (BER), frame error rate (FER), and/or ACP.

As one example of measurement of a performance metric that may be useful in generating calibration data for the pre-distortion block 514, in some embodiments, the power consumption of the PA 508 may be monitored as a function of varying levels of the pre-distorted dynamic input bias signal. One power consumption monitoring method for a FET-based PA 508 is to measure the $V_{DD}$ and $I_{DD}$ values applied to the power terminals of the PA 508. This may be done, for example, using an analog-to-digital converter to directly sense $V_{DD}$ and $I_{DD}$ (rather than using a scaled replica FET, as is typically done in analog active bias circuits). Another method may be to measure temperature changes in the PA 508 as the pre-distorted dynamic input bias signal is varied, as a surrogate for power consumption changes. For example, the temperature may be estimated by measuring a voltage drop across a diode physically placed close to the PA power transistor, minimizing the measurement delay effect, since the thermal time constant of the diode is low, and thus the measurement is fast (near real-time).

As another example, a closed loop comprising a remote gateway 106 and a user terminal 102 having a power amplifier with a pre-distorted dynamic input bias signal may be used to measure one or more performance metrics and generate corresponding calibration data for the pre-distortion block 514. This method takes advantage of existing receiver circuitry in a user terminal 102 that is normally used for duplex data communications over an RF communications system between the user terminal 102 and a remote gateway 106.

In one embodiment, the gain of the power amplifier 508 in an RF transmitter 500 in a user terminal 102 undergoing calibration is measured as a function of the power level of a test signal at a receiver in the remote gateway 106. In some embodiments, one or more processing nodes at the gateway 106 process the measured data and calculate pre-distortion polynomial coefficients according to the algorithm described above or a comparable algorithm. In other embodiments, the raw measured data is sent back to the user terminal 102 under test, and calculation of pre-distortion polynomial coefficients is done locally in the user terminal 102. In either case, raw or processed measured data is modulated, fed back via the RF communications network 110 to a receiver in the user terminal 102, demodulated within the user terminal 102, and coupled to the envelope pre-distortion block 514 in the RF transmitter 500 of the user terminal 102. As part of the calibration process, the RF transmitter 500 undergoing calibration may vary the transmitted test signal (e.g., gradually increasing power level), receive new feedback from the remote gateway 106, again vary the transmitted test signal (e.g., increasing the power level again), and repeating the operation until the gain over the entire signal range is measured. Based on the feedback data, counteracting polynomial coefficients are computed (usually at the remote gateway 106, but optionally within the user terminal 102 undergoing calibration) and provided to the pre-distortion correction block 514.

In alternative embodiments, the gateway 106 may measure one or more other performance metrics of a test signal transmitted from the user terminal 102, such as compression and/or EVM. As with gain used as a performance metric, the pre-distortion correction block 514 within the user terminal 102 adjusts the pre-distortion correction terms and then transmits an updated signal; the operation repeats and continues in a closed loop manner as described above. For EVM in particular, one pre-distortion algorithm may use an adaptive filter which optimizes EVM while adjusting envelope pre-distortion coefficients; the correction term is adjusted until an optimum EVM with minimum power is achieved, the process iteratively repeating in a closed loop until an overall optimum EVM result is obtained.

Dedicated time slots may be used for calibration purposes enabling use of test signals without interfering with normal data signal traffic. However, while many embodiments may use an optimized test signal that facilitates measurement of the desired performance metrics, in some embodiments the transmitted test signal may be a normal data signal, and thus monitoring of performance metrics for maintenance purposes may be performed during normal data communications.

In some embodiments, the calibration test may be performed at different channel frequencies within the operating frequency range. Upon completing an initial calibration, the calibration loop may be re-performed from time to time to update the feedback calibration data and maintain target conditions. The rate of such updates may be adjusted to the rate at which the transmission characteristics change; for example, constant, faster, or slower updates, depending on the cause of such changes. Thus, updates to measure transmission characteristic changes caused by temperature and component ageing may be at a slower rate, while updates to measure changes caused by power supply voltage fluctuations may be at a faster rate.

The calibration methods described above may be used to save power in a system having a phase-array antenna and numerous corresponding transmitters (typically one transmitter per antenna element or per group of a few antenna elements). In such a system, the correction coefficients may be optimized on an average basis and a common pre-distorted dynamic input bias signal distributed to each of the transmitter amplifiers.

Timing Adjustment

It may be desirable in some embodiments to match the timing of signals in the information signal path (from the digital modulator 502 to the adder 506 in the illustrated example) with the timing of signals in the parallel envelope signal path (from envelope computation block 510 to the adder 506 in the illustrated example) Timing mismatches between the signal paths may occur because of differing amounts of time required to process incoming source information on one signal path versus the other signal path. Accordingly, in some embodiments, an optional delay module 516 may be inserted within one or both signal paths to adjust the timing of signals in the corresponding signal path to match the timing of signals in the other signal path. In some embodiments, the amount of delay may vary as a function of the source information signal, and thus delay module(s) 516 providing a programmable amount of delay may be utilized.

In the illustrated example, the delay module(s) 516 are shown as part of the digital modulator 102 and the pre-distortion block 514, and in many embodiments it would be convenient to locate the delay function in one or both of those elements. However, the delay module(s) 516 may be placed anywhere in the signal paths after the digital modulator 502, and thus the positions shown in FIG. 5 are illustrative only. It is generally most convenient and accurate to apply any delay on the digital side of the DACs 504, 512, but delay could be applied on the analog side of the DACs 504, 512.

DC Biasing & Selective Pre-Distortion

As should be clear, the dynamic input bias signal is normally time-varying. In some embodiments, it may be useful to include a DC bias (positive or negative) to the input of the PA 508. For example, providing a DC bias allows use of DACs 504, 512 having a lesser dynamic range. An optional DC bias source may be coupled to the adder 506, as shown in FIG. 5. Alternatively, a DC bias may be introduced within the envelope computation block 510, within the pre-distortion block 514, or within or after the DAC 512, or by a separate circuit (not shown) coupled to the envelope signal path.

The level of DC bias may be changed relative to the voltage (or current) of the envelope E or the pre-distorted envelope E'. For example, a greater DC bias can be applied when at least one of the envelopes E, E' is below a first threshold, and a lesser DC bias applied when such envelope is above a second threshold (which may be the same as or different from the first threshold). This method can further reduce power consumption be reducing the bias to the PA 508 when the envelop level is greatest. In some embodiments, the DC bias can be dynamic, e.g., inversely proportional to an envelope (E or E'). In some embodiments, a negative DC bias may be applied when at least one of the envelopes E, E' is above a threshold, further reducing power consumption by the PA 508.

Figure 7:
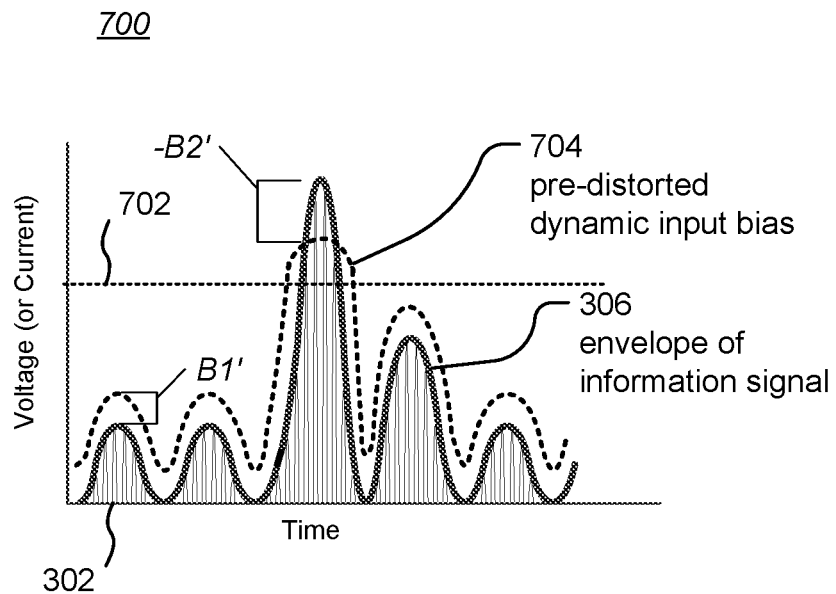
FIG. 7 is a graph of an information signal having varying voltage (or current) over time in a transmitter having a power amplifier with a dynamic input bias signal, illustrating a threshold level over which pre-distortion is less than below the threshold level.

In some embodiments, rather than or in addition to applying a DC bias, it may be desirable to selectively apply pre-distortion only on low and medium envelope levels, while higher envelope levels that are in the compression region of the PA 508 are left uncorrected, or are less corrected, or are even negatively corrected. For example, FIG. 7 is a graph 700 of an information signal having varying voltage (or current) over time in a transmitter having a power amplifier with a dynamic input bias signal, illustrating a threshold level 702 over which the applied pre-distortion 704 is less than the pre-distortion applied below the threshold level. For the illustrated embodiment, the pre-distortion of the dynamic input bias signal is actually negative above the threshold level 702 (compare the pre-distortion level at B1' to the pre-distortion level at −B2').

Such selective correction may be optimized for optimum performance/power consumption trade-off. In some embodiments, this trade-off may be optimized by successively increasing the portion of the envelope signal range, from lower levels to higher levels, that is pre-distorted, while concurrently monitoring the performance of the PA 508. For example, the EVM of the PA 508 output may be correlated with the amount of signal compression at each value point within the envelope signal level range, and the bias profile optimized to achieve minimum power consumption while ensuring a desired EVM parameter is met.

Accordingly, a dynamic input bias signal (comprising the pre-distorted envelope E' of the information signal), the information signal itself, and any added DC bias are combined and applied to the input of the PA 508. The power (voltage/current) applied to the power terminals of the PA 508 can remain constant, yet power consumption is reduced due to the dynamic nature of the input bias signal.

Correction of Residual Distortion

In some applications, there may be some residual distortion in the combined signal that is applied to the signal input of a power amplifier. Such residual distortion, if any, can be reduced by additional correction (pre-distortion) in the information signal path, separate from the envelope signal path. For example, referring to FIG. 5, an optional linearization block 518 may be included in the information signal path. Linearization is essentially a form of pre-distortion that modifies an information signal to counteract the non-linear characteristics of a typical power amplifier.

Embodiments of the invention that include an optional linearization block 518 may take advantage of the existing receiver within a user terminal 102—normally used for duplex data communications—to off-load the process of computing linearization calibration data from the user terminal 102 to one or more processing nodes in a gateway 106. Such a calibration/linearization process is a closed loop system, albeit with a "long" loop through an interconnecting RF communications network 110.

More specifically, in some embodiments, the gateway 106 measures a selected performance metric (e.g., EVM, spectral regrowth, intermodulation, etc.) of a signal transmitted from the user terminal 102 through the RF communications network 110 to the gateway 106. The transmitted signal may be a regular modulation signal or may be an optimized test signal facilitating measurement of the desired parameters. In one embodiment, the gateway 106 processes the measured data and calculates linearization coefficients/parameters according to a linearization algorithm (described below), and sends that information back to the user terminal 102. The received information is captured by an antenna 104', and converted by a receiver and demodulator module 520 to digital data that is coupled to the linearization block 518.

The antenna 104' may be a separate antenna, or may be the same as the transmit antenna 104, with a diplexer or other circuitry separating incoming from outgoing RF signals; if an electronic phase-array antenna is used, separate receive and transmit antenna elements may be used without diplexers. The receiver and demodulator module 520 may include, for example a low noise amplifier (LNA), a downconverter circuit, an analog-to-digital circuit, and a demodulator which essentially performs the inverse function of the digital modulator 502.

The received digital data from the receiver and demodulator module 520 is used by the linearization block 518 to adjust the correction (linearization) terms. An updated test signal is then transmitted by the PA 508 to the gateway 106. The operation repeats and continues in a closed loop manner until the entire signal range is measured. As with calibrating the pre-distortion block 514, upon completing an initial linearization calibration, the calibration loop may be re-performed from time to time to update the feedback calibration data and maintain target linearization conditions. The rate of such updates may be adjusted to the rate at which the transmission characteristics change (e.g., constant, faster, or slower updates), depending on the cause of such changes. Thus, updates to measure transmission characteristic changes caused by temperature and component ageing may be at a slower rate, while updates to measure changes caused by power supply voltage fluctuations may be at a faster rate.

As with calibrating the pre-distortion block 514, dedicated time slots may be used for linearization calibration purposes, enabling use of test signals without interfering with normal data signal traffic. However, in some embodiments, monitoring of performance metrics for maintenance purposes may be performed during normal data communications.

One linearization algorithm that may be used to set the operating parameters of the linearization block 518 uses an adaptive filter which minimizes EVM while adjusting non-linear pre-distortion coefficients. The amplitude of a non-linear correction term is adjusted until the best EVM is achieved, then a phase correction term is adjusted for best EVM. The process is iteratively repeated in a closed loop until an overall best EVM result is obtained.

An advantage of off-loading the process of computing linearization calibration data from user terminals 102 to a gateway 106 is that the gateway 106 generally already has more computational power for other functions, and the user terminals 102 do not need to expend either computing time or electrical power in making such computations.

Another advantage of the disclosed method is that the remote gateway 106 processes the actual signal that is transmitted from a user terminal 102, as opposed to the user terminal 102 sampling or tapping a local signal, which may not represent exactly the actual transmitted signal (for example, because of imperfections of a directional coupler, mismatches/reflections, signal leakages, etc.). This advantage is particularly useful in embodiments of the invention that use frequency-division duplexing (FDD), such as LTE mobile phone, satellite systems, etc. In FDD systems, the receiver and transmitter in a user terminal 102 may operate at different frequencies. In this case the receiver may not be able to tune on the transmit frequency, and an additional, dedicated receiver would be needed to monitor the transmitter. Accordingly, a "long loop" linearization process as described above is particularly useful since actual transmitted signals cannot be easily locally sampled.

Supply Voltage Biasing

Another aspect of the invention includes both pre-distorted dynamic input biasing—which effectively biases the supply current ($I_{DD}$ or $I_{CC}$) through a power amplifier as a function of the envelope E—and biasing of the supply voltage ($V_{DD}$ or $V_{CC}$) to the power amplifier as a function of the occurrence of peaks in the envelope E. Biasing both supply current and supply voltage can result in a significant reduction in power consumption in the PA 508.

In embodiments of the invention with dual biasing, the supply current bias is fast, tracking at the full information signal envelope rate, while the supply voltage bias is slower, tracking at a lower speed only the peaks of the envelope that exceed some threshold or meet some specified criteria. This behavior may be achieved by digital processing, including computing the envelope E and deciding which peaks to track and which ones to partially track or not track at all, as described in further detail below. Increasing the supply voltage to a PA 508 only for peaks above a specified threshold may be at a rate that can be met by the supply voltage source.

Figure 8:
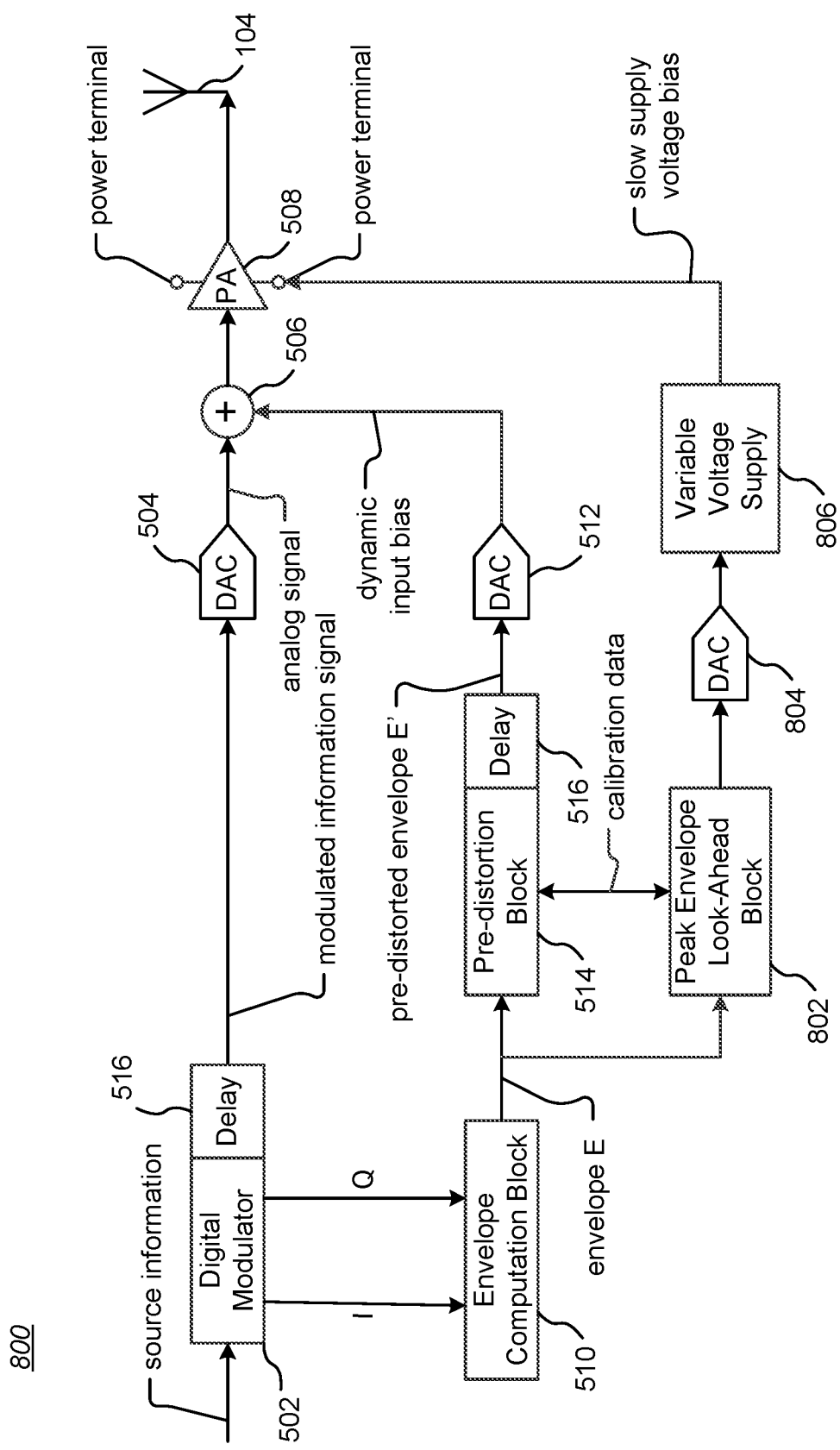
FIG. 8 is a block diagram of one embodiment of a transmitter that includes digital biasing of both supply current through and supply voltage to a power amplifier.

FIG. 8 is a block diagram of one embodiment of a transmitter 800 that includes digital biasing of both supply current through and supply voltage to a PA 508. Generation of the dynamic input bias signal is as shown in FIG. 5. In addition, a parallel peak envelope signal path applies the envelope signal E to a peak envelope look-ahead block 802. The digital output of the peak envelope look-ahead block 802 is coupled to a DAC 804, which controls the voltage output of a variable voltage supply 806. The output of the variable voltage supply 806 is a slowly varying voltage that is applied to a power terminal of the PA 508 (the other power terminal—the DC return path—is generally at RF ground).

The nature of a variable voltage supply 806 is that it has a limiting rate at which it can ramp up voltage—that is, it cannot instantly output a specified voltage. Further, the larger the voltage excursion specified, the more time is required for the variable voltage supply 806 to reach a specified voltage, and the time proportion may not be a linear function. Thus, for example, moving from an output of 16 volts to 24 volts may take more than twice as long as moving from an output of 16 volts to 20 volts, and both changes may take an appreciable amount of time relative to the rate of change of the envelope E of an information signal.

The function of the peak envelope look-ahead block 802 is to monitor the data representing the waveform of the envelope E of the information signal and determine only the peaks of the envelope that exceed a threshold or some other criteria. In addition, the peak envelope look-ahead block 802 must operate sufficiently ahead of the generation of the dynamic input bias signal so as to enable the variable voltage supply 806 to timely output a desired supply voltage bias to the PA 508 to meet the incoming envelope peaks and achieve a desired performance level. Because of this look-ahead characteristic, a delay module 516 may be included to delay the information signal path and the envelope signal path (through the pre-distortion block 514) in order to provide sufficient look-ahead time to the look-ahead block 802, as well as to adjust inter-path timing (see the description above about the options for placement of the delay modules 516).

The peak envelope look-ahead block 802 estimates the minimum supply voltage needed to meet desired performance specifications for an incoming envelope peak and sends a control command through the DAC 804 to the variable voltage supply 806 to output that minimum voltage. The command is sent early enough to the variable voltage supply 806 before the (delayed) envelope peak is output as a dynamic input bias level, based on the knowledge of the response time of the variable voltage supply 806 (which in turn depends on its loop bandwidth and other characteristics, as well as the amount of voltage change that needs to be made in the available time), giving enough time to the variable voltage supply 806 to react and adjust the output voltage to meet the incoming envelope peak.

More particularly, the peak envelope look-ahead block 802 may include a buffer memory that stores a running sequence of values representing the envelope E; the buffer memory length may be optimized to match the response time of the variable voltage supply 806. The stored values are analyzed to track high envelope peaks (e.g., point P in FIG. 3), and whether lower peaks can be tracked downwards from the higher peaks, based on their time occurrence and level values, considering the timing and level of the next incoming higher peak. For example, if two high peaks occur fairly close together, intervening lower peaks may be ignored so as to not try to slew the output of the variable voltage supply 806 from high to low and then back to high within a short time span.

The result is that some of the medium and low peaks may only be partially tracked down, or not tracked at all, from higher voltages. This approach allows a relatively slow variable voltage supply 806 to be used, with a response time slower than the envelope rate, while ensuring that the output supply voltage provided to the PA 508 is always either equal to or above the minimum voltage to meet a desired performance level. While the efficiency improvement may not be as high as if the supply voltage tracked the envelope E at full speed, the power reduction may still be significant since there are generally periods of time during which the supply voltage is at a reduced level corresponding to a run of lower level envelope peaks.

In general, the DAC 804 driving the variable voltage supply 806 does not need to be fast; it can be just a few times faster (usually no more than about 10 times faster) than the loop bandwidth of the variable voltage supply 806. For example, if the variable voltage supply 806 has a 10 kHz bandwidth, the DAC 804 need be no faster than about 100 kHz. In some embodiments, the function of the voltage control DAC 804 may be implemented as a filtered pulse width modulation (PWM) digital output from the peak envelope look-ahead block 802. In other embodiments, the function of the voltage control DAC 804 may be integrated within the variable voltage supply 806.

The dynamic input bias signal to the input of the PA 508 may be additionally pre-distorted to correct for any distortion that may occur due to varying the supply voltage to the PA 508. However, the voltage levels mapped to envelope peaks may then need to be re-adjusted to correct for such changes in the pre-distortion of the dynamic input bias signal. Accordingly, a calibration process similar to one of the types described above may be iteratively applied to adjust both the pre-distortion block 514 and the peak envelope look-ahead block 802 for optimum operation with respect to each other.

In an alternative embodiment, the output level of the variable voltage supply 806 may be intermittently (substantially statically) settable rather than dynamically controlled as a function of the peaks of the envelope E (accordingly, the peak envelope look-ahead block 802 may be eliminated or bypassed). More particularly, the output level of the variable voltage supply 806 may be optimized (statically adjusted) for the actual power amplifier device used in a transmitter, and subsequently adjusted in response to tracked factors, such as temperature and component ageing. A closed or open control loop coupled (directly or indirectly) to the variable voltage supply 806 would measure a tracked parameter (e.g., temperature of the PA 508) from time to time and adjust the supply voltage output level to an optimum value for the measured condition.

In yet another embodiment, the variable voltage supply 806 may be coupled to both a peak envelope look-ahead block 802 (to allow dynamic control of its output voltage as a function of the envelope peaks), and to a control loop that provides for intermittently setting a minimum output voltage. The intermittently settable capability may be useful, for example, to adjust the minimum output voltage to cope with the effects of temperature and component ageing, while allowing dynamic changes as a function of envelope peaks to reduce average power consumption.

Figure 9:
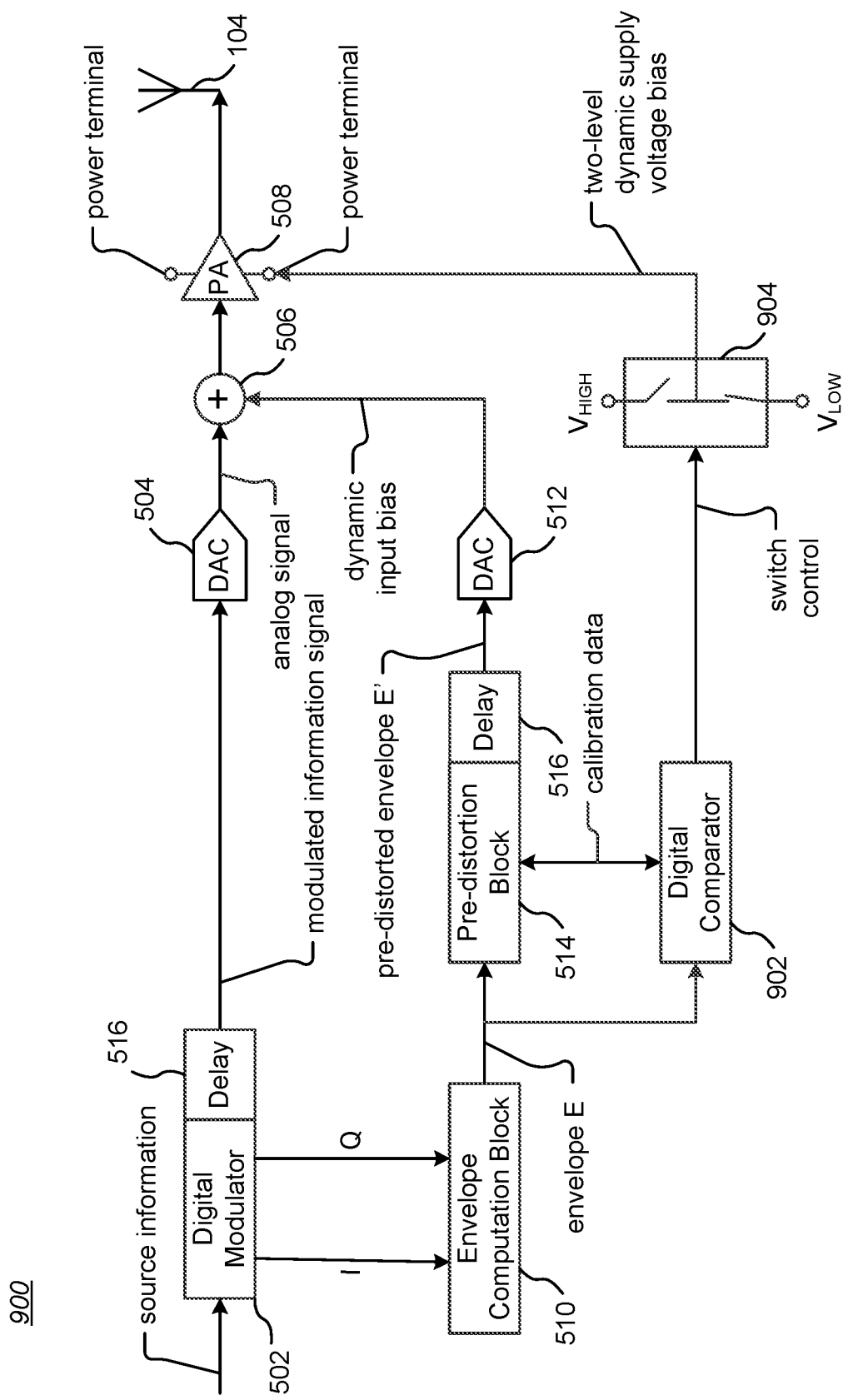
FIG. 9 is a block diagram of a simplified embodiment of a transmitter that includes digital biasing of both supply current through and supply voltage to a power amplifier.

FIG. 9 is a block diagram of a simplified embodiment of a transmitter 900 that includes digital biasing of both supply current through and supply voltage to a power amplifier 508. Generation of the dynamic input bias signal is as shown in FIG. 5. In addition, a parallel envelope signal path applies the envelope signal E to a digital comparator 902, which outputs a switch control signal to a switch module 904 to select either a high voltage potential $V_{HIGH}$ or a low voltage potential $V_{LOW}$ as the supply voltage ($V_{DD}$ or $V_{CC}$) for the PA 508.

In the illustrated example, the switch module 904 controlled by the digital comparator 902 includes top and bottom switches that are in mutually complementary states. In some embodiments, the bottom switch (for $V_{LOW}$) is replaced with a Schottky diode, which will behave as a switch in light of the relative voltages of $V_{HIGH}$ and $V_{LOW}$.

In this simplified version of the circuit shown in FIG. 8, the digital comparator 902 may simply compare the values of the envelope E to a threshold value, and select $V_{HIGH}$ when the envelope exceeds the threshold, and revert back to $V_{LOW}$ when the envelope falls below the threshold. Some hysteresis may be added within the digital comparator 902 to prevent oscillatory behavior. The threshold will generally be determined by calibration and optimized for minimum power consumption, while meeting desired performance levels. Any distortion that may occur due to switching transients may be calibrated and reduced by additional, counteracting pre-distortion in the dynamic input bias path.

As should be clear, the switch module 904 may be configured to select and output more than two supply voltages. For example, the digital comparator 902 may output "low", "medium", and "high" switch control signals based on comparing the envelope E to two spaced-apart threshold values.

Multi-Level Regulated Voltage Supply

Embodiments of the circuit shown in FIG. 9 require at least two voltage levels (e.g., $V_{HIGH}$ and $V_{LOW}$). As a practical matter, such a voltage supply should provide a regulated, substantially constant voltage for some specified range of loads. Conventionally, if an electronic device requires two or more regulated voltages, each regulated voltage is generated and maintained by a separate voltage regulator circuit, which takes up space on the device and is thus costly. Accordingly, it would be useful if a single circuit could provide two or more regulated voltages.

Figure 10A:
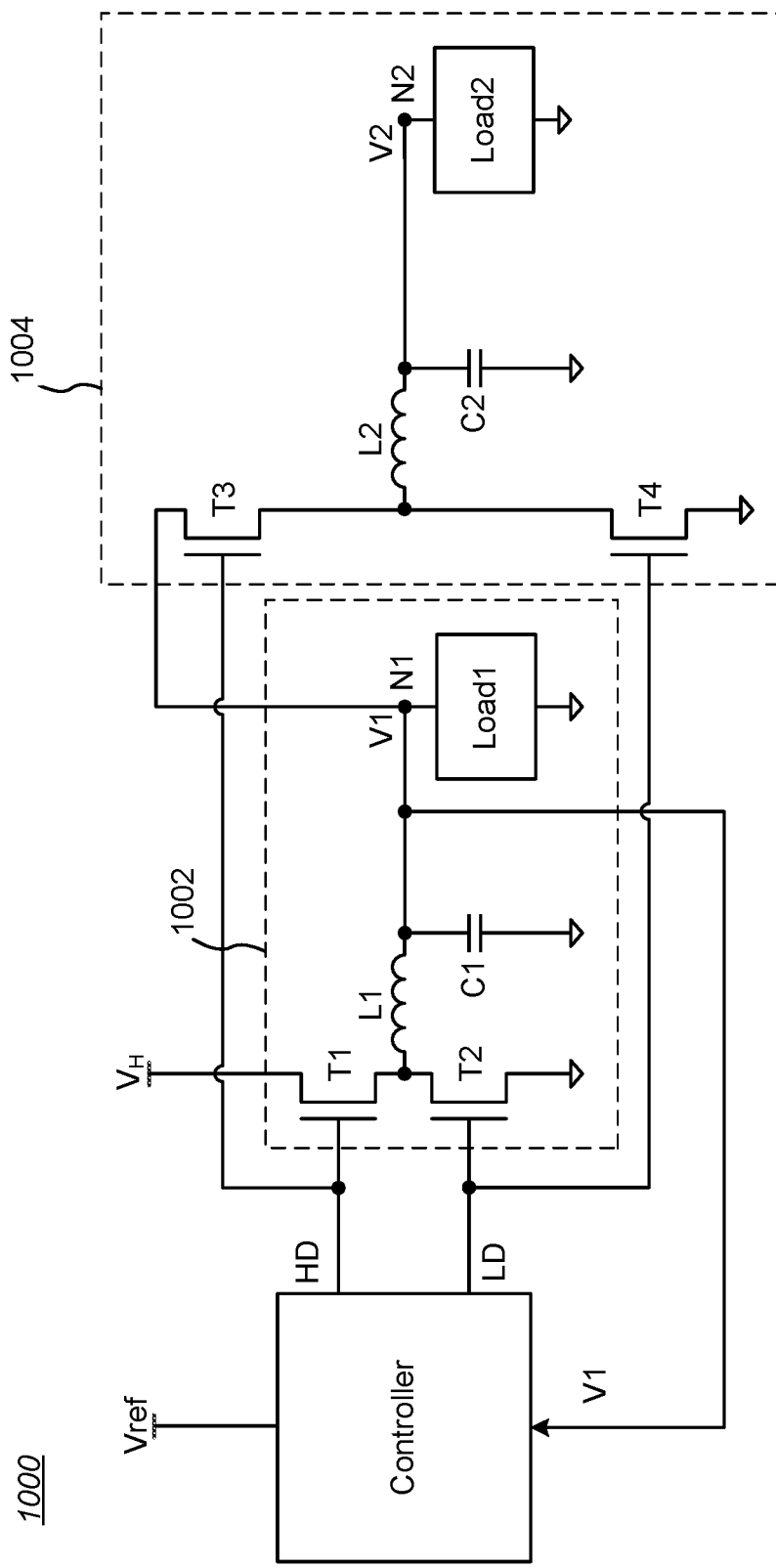
FIG. 10A is a schematic diagram of a "chained" feedback regulated voltage supply circuit.

FIG. 10A is a schematic diagram of a "chained" feedback-regulated voltage supply circuit 1000. The illustrated embodiment eliminates the need for separate regulator circuits for each regulated voltage. The illustrated regulated voltage supply circuit 1000 is designed to automatically maintain a substantially constant voltage V1 at a first node N1 for a first load, Load1, and maintain a substantially constant voltage V2 at a second node N2 for a second load, Load2.

In greater detail, the illustrated regulated voltage supply circuit 1000 is a DC/DC (switch-mode) type converter which steps down an applied high voltage to V1 (also known as a "buck" converter). In alternative embodiments, the regulated voltage supply circuit 1000 may be configured to step up an applied source voltage (also known as a "boost" converter).

The regulated voltage supply circuit 1000 includes at least two stages. In the illustrated example, a first output stage 1002 includes two stacked switches T1 and T2 series coupled as shown between a source voltage (high voltage $V_H$) and a low voltage (typically circuit ground). A first LC circuit comprising an inductor L1 and a capacitor C1 is coupled between the junction of T1 and T2, and Load1. Similarly, a second output stage 1004 includes stacked switches T3 and T4 series coupled as shown between a source voltage (V1 in this case) and a low voltage (typically circuit ground). A second LC circuit comprising an inductor L2 and a capacitor C2 is coupled between the junction of T3 and T3, and Load2. Additional similar output stages may be "chained" in a like manner; for example, a third stage may utilize V2 as its source voltage. In some embodiments, all of the switches (T1-T4 in this example) may be field effect transistors (FETs). In some embodiments, the "top" switches (T1 and T3 in this example) may be FETs, while the "bottom" switches (T2 and T4 in this example) may be Schottky diodes.

The regulated voltage supply circuit 1000 also includes a Controller that provides a sequence of first control pulses HD (for "high drive") and a sequence of second control pulses LD (for "low drive"). The HD and LD control pulses are non-overlapping and complementary to each other (thus, their duty cycles are also complementary). In the illustrated example, the HD control pulses are connected to the control inputs (e.g., FET gates) of T1 and T3, while the LD control pulses are connected to the control inputs of T2 and T4 (see the discussion of FIG. 10B below for an alternative configuration). Note that if Schottky diodes are used for the "bottom" switches (T2 and T4 in this example), the diodes switch on their own based on the voltage polarity, and thus the LD control pulses are not needed.

The regulated voltage supply circuit 1000 further includes a feedback loop from N1 to the Controller that operates by comparing the actual voltage V1 at node N1 to a reference voltage Vref. The Controller adjusts the duty cycle of the HD and LD control pulses to maintain V1 at the Vref target value. For example, if $V_H$ decreases, the feedback loop increases the duty cycle of the HD control pulses to allow $V_H$ to be coupled through T1 to N1 longer (in the case of a duty-cycle-controlled DC/DC converter) or more frequently (in the case of a frequency-controlled switcher) to compensate for the change. More generally, the Controller adjusts the duty cycle ("d") of the control pulses to achieve a target output voltage output V1, so V1 is substantially equal to $d*V_H$.

The regulation of V2 is chained to V1, and T3 and T4 are switched by the HD and LD control pulses at the same rate and at the same duty cycle as T1 and T2, respectively, with regard to FIG. 10A. Any level shifters or scaling circuitry that may be needed to properly drive T3 and T4 are not shown for simplicity. The same duty cycle d is thus applied to the chained switches T3 and T4, resulting in a voltage ratio V2/V1 being substantially the same as the voltage ratio V1/$V_H$:

$$V1/V_H = d = V2/V1 \Rightarrow V1 = d*V_H \text{ and } V2 = d^2*V_H \quad \text{EQ. 4}$$

For example, if d=½ or 50%, V1 will be one-half of $V_H$, and V2 will be one-half of V1 (i.e., one quarter of $V_H$); for $V_H$=48V, in this example, V1 would be 24V and V2 would be 12V (ignoring possible voltage output variations due to parasitic losses, such as in the inductors, L1, L2).

Figure 10B:
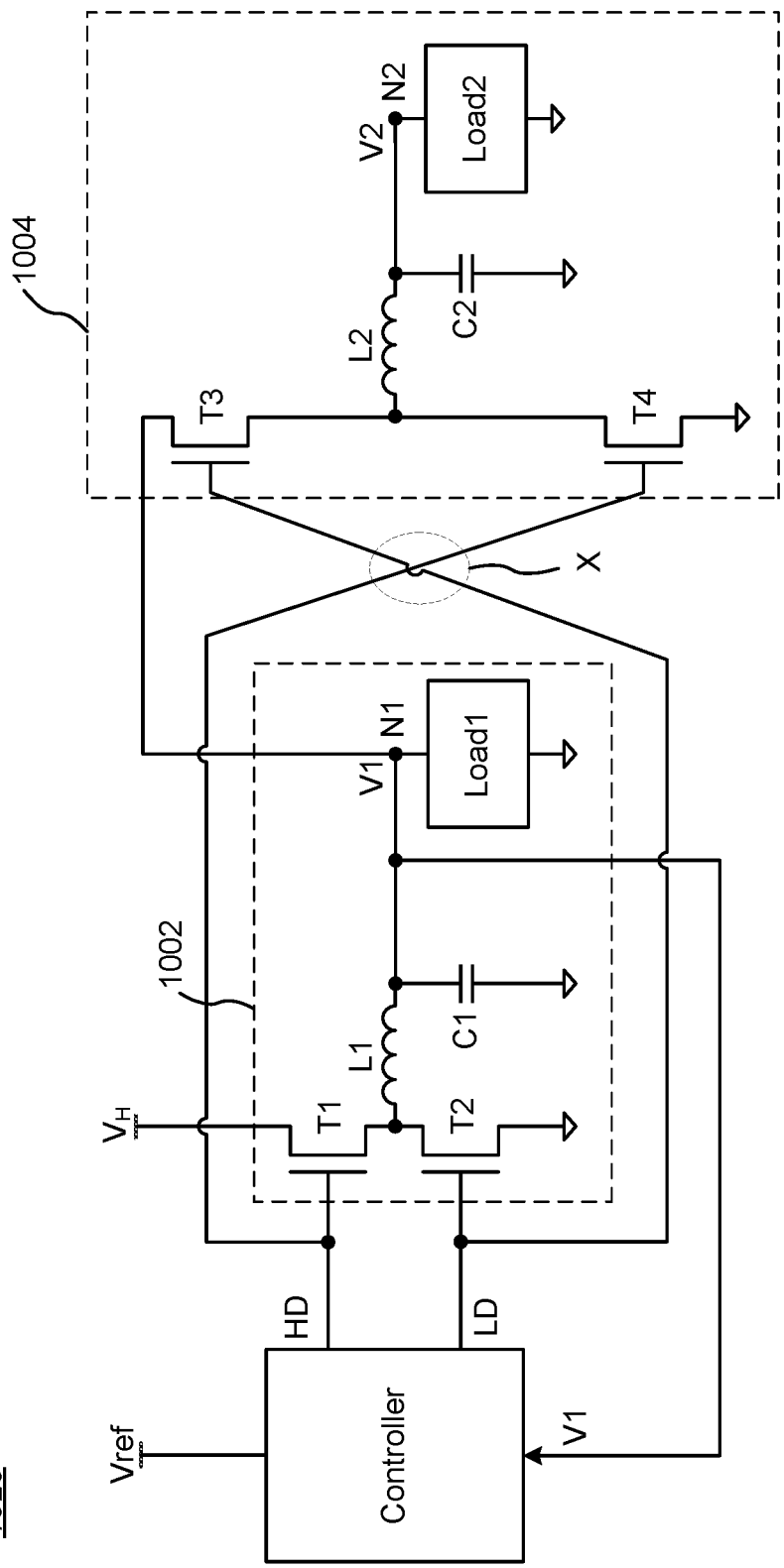
FIG. 10B is a schematic diagram of an alternative "chained" feedback regulated voltage supply circuit.

FIG. 10B is a schematic diagram of an alternative "chained" feedback regulated voltage supply circuit 1020. In the illustrated example, the HD control pulses are connected to the control inputs of T1 and T4, while the LD control pulses are connected to the control inputs of T2 and T3 (with offsets and scaling, if needed, for proper driving levels). Thus, compared to FIG. 10A, the HD and LD control pulse lines cross over each other, as indicated by the dashed oval X. For this configuration, V2=$d*(1-d)*V_H$. In a variant configuration, by disconnecting T3 from N1 and connecting the same terminal of T3 to $V_H$ (i.e., feeding T3 from $V_H$ instead of from V1, but keeping the "crossed" LD and HD control pulse connections shown in FIG. 10B), then V2=$(1-d)*V_H$. In yet another variant configuration, by feeding T3 from $V_H$ but coupling the HD and LD control pulses as shown in FIG. 10A, then V2=$d*V_H$, which is essentially the same as V1; this configuration may useful to achieve greater current capability at the same voltage without requiring larger switches (T1-T4, in this example) and higher inductor and capacitor sizes that may be needed in a single (conventional) stage voltage supply circuit. As should be clear, by inserting switches at appropriate locations to control which control pulses are applied to the control inputs of T3 and T4, and/or to control the voltage inputs to T3, one circuit can be fabricated that can output any of up to four different values for V2: V2=$d*V_H$; V2=$d^2*V_H$; V2=$d*(1-d)*V_H$; and/or V2=$(1-d)*V_H$.

The "chained" regulated voltage supply circuits of FIG. 10A or 10B, and their variants, thus provide at least two output voltage levels with only one Controller, thus saving space and cost. Such a circuit thus may be quite useful for embodiments of the circuit shown in FIG. 9, which require at least two voltage levels; for example, V1 may be used for $V_{HIGH}$, and V2 may be used for $V_{LOW}$ (load would not be a factor in such an application, since only one load would be connected at a time due to the complementary states of the top and bottom switches in the switch module 904). Furthermore, the "chaining" architecture can be extended by adding more stages in a similar manner, each new stage feeding off from the previous stage. For example, a third stage can be chained to the second stage 1004 by feeding off from V2 and being switched by HD. The third stage would produce a voltage V3 that would be equal to $d*V_H$. Moreover, by inserting switches at appropriate locations to control which control pulses are applied to the control inputs of the switches of each stage, and/or to control the voltage inputs to each stage, one circuit can be fabricated that can output even more supply voltages at low cost.

Methods

Another aspect of the invention includes a method for biasing a telecommunications system transmitter circuit, comprising: receiving digital source information; generating a modulated information signal from the received digital source information; generating a dynamic input bias signal as a function of the envelope of a form of the source information; combining the modulated information signal and the dynamic input bias signal; and outputting an analog signal of the combined modulated information signal and dynamic input bias signal, the analog signal suitable to be applied to an input of a power amplifier.

Yet another aspect of the invention includes a method for biasing a telecommunications system transmitter circuit, comprising: receiving digital source information; generating a modulated information signal from the received digital source information; generating a dynamic input bias signal as a function of the envelope of a form of the source information; combining the modulated information signal and the dynamic input bias signal; outputting an analog signal of the combined modulated information signal and dynamic input bias signal; and coupling the analog signal to the input of a power amplifier, for amplification by the power amplifier.

Still another aspect of the invention is a method for biasing a telecommunications system transmitter circuit, comprising: receiving digital source information; generating a modulated information signal from the received digital source information; applying a linearizing transform function to the modulated information signal; applying a transform function to the envelope of a form of the source information to generate a pre-distorted envelope; generating a dynamic input bias signal as a function of the pre-distorted envelope; combining the linearized modulated information signal and the dynamic input bias signal; outputting an analog signal of the combined linearized modulated information signal and dynamic input bias signal; and coupling the analog signal to the input of a power amplifier, for amplification by the power amplifier.

Additional aspects of one or more of the above methods include: applying a transform function to the envelope of the source information before generating the dynamic input bias signal, such that the dynamic input bias signal is a pre-distorted dynamic input bias signal; the transform function applying a first pre-distortion level for envelope levels below a selected threshold, and a second pre-distortion level, less than the first pre-distortion level, for envelope levels above the selected threshold; the transform function being applied only to envelope levels below a selected threshold; the transform function being an inverse profile of a gain profile of the power amplifier; receiving from a remote gateway a calibration signal derived from signals transmitted by the telecommunications system transmitter circuit, and adjusting the transform function as a function of the received calibration signal; determining the pending occurrence of peaks in the envelope of the information signal, and outputting a supply voltage for the power amplifier, the supply voltage having a voltage potential as a function of the determined occurrence of pending peaks in the envelope of the information signal; adjusting the transform function as a function of the supply voltage potential; determining the occurrence of peaks in the envelope of the information signal that exceed at least one selected threshold, and outputting a first supply voltage to the power amplifier in response to the determined occurrence of peaks in the envelope of the information signal that exceed the at least one selected threshold, and otherwise outputting a second supply voltage to the power amplifier; adjusting the transform function as a function of the supply voltage output; applying a linearizing transform function to the modulated information signal; receiving from a remote gateway a calibration signal derived from signals transmitted by the telecommunications system transmitter circuit, and adjusting the linearizing transform function as a function of the received calibration signal; adding a selected amount of DC bias to the input of the power amplifier.

Another aspect of the invention includes a method for providing two or more regulated output voltages, comprising: providing a first output stage comprising stacked transistors configured to be coupled between a first voltage and a second voltage, each transistor having a corresponding control input, the first output stage configured to provide a first output voltage at a first output node; providing at least one subsequent output stage, each subsequent output stage comprising stacked transistors configured to be coupled between (1) either the output node of a previous output stage or the first voltage and (2) the second voltage, each transistor having a corresponding control input, each subsequent output stage configured to provide a corresponding subsequent output stage output voltage at a corresponding output node; and providing a controller, configured to be coupled to a reference voltage and coupled to the first output voltage from the first output stage, the controller outputting a first output pulse signal and a non-overlapping and complementary second output pulse signal, wherein the first output pulse signal is coupled to the control input of one of the two transistors in each output stage, and the second output pulse signal is coupled to the control input of the other of the two transistors in each output stage, wherein the controller regulates the duty cycles of the first and second output pulse signals as a function of a comparison of the reference voltage to the first output voltage.

Still another aspect of the invention includes a method for providing two regulated output voltages, comprising: providing a first output stage comprising stacked field-effect transistors (FETs) configured to be coupled between a first voltage and ground, each FET having a corresponding control input, the first output stage configured to provide a first output voltage at a first node; providing a second output stage comprising stacked FETs configured to be coupled between (1) either the output node of the first stage or the first voltage and (2) ground, each FET having a corresponding control input, the second output stage configured to provide a second output voltage at a second output node; and providing a controller, configured to be coupled to a reference voltage and coupled to the first output voltage from the first output stage, the controller outputting a first output pulse signal and a non-overlapping and complementary second output pulse signal, wherein the first output pulse signal is coupled to the control input of one of the two transistors in each of the first and second output stages, and the second output pulse signal is coupled to the control input of the other of the two transistors in each of the first and second output stages, wherein the controller regulates the duty cycles of the first and second output pulse signals as a function of a comparison of the reference voltage to the first output voltage.

Additional aspects of one or more of the above methods for providing regulated output voltages include: each transistor being a field-effect transistor; and the subsequent output stage output voltage of a first of the at least one subsequent output stage being approximately one of $d*V_H$, $d^2*V_H$, $d*(1-d)*V_H$, or $(1-d)*V_H$, where d is the duty cycle of the first and second output pulse signals, and $V_H$ is the first voltage.

Fabrication Technologies and Options

In practical implementations, modulating the input signal bias at the envelope frequency may produce spectral energy at the envelope frequency at the output of the PA 508. Accordingly, that energy may need to be filtered out. A conventional output filter or matching network can be used to accomplish this filtering function; the wider the separation between the RF carrier frequency and the envelope frequency, the easier the filtering. In addition, anti-aliasing filters and interface circuits between the DACs 504, 512 and the input of the PA 508 may be needed.

As should be readily apparent to one of ordinary skill in the art, various embodiments of the invention can be implemented to meet a wide variety of specifications. Circuits that may be needed for particular applications (such as for up or down frequency conversion, voltage offsets, negative supply rail, etc.) are not shown for simplicity.

While the description above has focused on the transmitter circuitry of user terminals 102 by way of example, the invention may be applied to transmitter circuitry within a gateway 106 as well to lower power consumption.

While the embodiments described above and illustrated in the figures contain a variety of elements shown as separate function blocks, the functionality of such blocks may be integrated into fewer blocks or more blocks. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to GaN, GaAs, standard bulk silicon, silicon-on-insulator (SOI), silicon-on-sapphire (SOS), and MESFET technologies.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that (1) as used in this specification, the accompanying figures, and the claims below, "comprising" is to be interpreted as meaning "including", "containing", "comprehending", and (2) the parenthetical labels for claim elements are for ease of referring to such elements, and do not in themselves indicate a particular required ordering or enumeration of elements; further, such labels may be reused in dependent claims as references to additional elements without being regarding as starting a conflicting labeling sequence).

What is claimed is:

1. A telecommunications system transmitter circuit, comprising:
   (a) a modulator for receiving digital source information and generating a modulated information signal;
   (b) an envelope computation block, coupled to the modulator, for receiving a form of the source information from the modulator and outputting an envelope of the form of the source information; and
   (c) combining and conversion circuitry, coupled to the modulator and the envelope computation block and configured to be coupled to a power amplifier having an input for receiving and amplifying an input signal and a power terminal for receiving a supply voltage, for receiving and digitally combining the modulated information signal and a dynamic input bias signal into a combined digital signal, converting the combined digital signal into an analog signal, and outputting the analog signal as the input signal to the input of a coupled power amplifier, wherein the dynamic input bias signal corresponds to the envelope of the form of the source information signal.

2. The invention of claim 1, further comprising the coupled power amplifier, wherein the output of the combining and conversion circuitry is connected to the input of the coupled power amplifier.

3. The invention of claim 1, further comprising a pre-distortion block, coupled between the envelope computation block and the combining and conversion circuitry, for applying a transform function to the envelope to generate a pre-distorted envelope, such that the dynamic input bias signal is a pre-distorted dynamic input bias signal.

4. The invention of claim 3, wherein the transform function applies a first pre-distortion level for envelope levels below a selected threshold, and a second pre-distortion level, less than the first pre-distortion level, for envelope levels above the selected threshold.

5. The invention of claim 3, wherein the transform function is applied only to envelope levels below a selected threshold.

6. The invention of claim 3, wherein the transform function is an inverse profile of a gain profile of the power amplifier.

7. The invention of claim 3, further comprising a receiver circuit, coupled to the pre-distortion block, for receiving from a remote gateway a calibration signal derived from signals transmitted by the telecommunications system transmitter circuit, wherein the pre-distortion block is configured to adjust the transform function applied by the pre-distortion block as a function of the received calibration signal.

8. The invention of claim 3, further comprising:
   (a) a peak envelope look-ahead block, coupled to the envelope computation block, for determining the pending occurrence of peaks in the envelope; and
   (b) a variable voltage supply, coupled to the peak envelope look-ahead block and to the power terminal of the power amplifier, for outputting a voltage in response to the determined occurrence of pending peaks in the envelope, wherein the pre-distortion block is configured to adjust the transform function applied by the pre-distortion block as a function of the voltage output by the variable voltage supply.

9. The invention of claim 1, further comprising:
(a) a peak envelope look-ahead block, coupled to the envelope computation block, for determining the pending occurrence of peaks in the envelope; and
(b) a variable voltage supply, coupled to the peak envelope look-ahead block and to the power terminal of the power amplifier, for outputting a voltage in response to the determined occurrence of pending peaks in the envelope.

10. The invention of claim 3, further comprising:
(a) a digital comparator, coupled to the envelope computation block, for determining the occurrence of peaks in the envelope that exceed at least one selected threshold; and
(b) a switch module, coupled to the digital comparator and to the power terminal of the power amplifier, and configured to be coupled to at least two voltage sources having different voltage potentials, for outputting a first selected voltage potential to the power terminal of the power amplifier in response to the determined occurrence of peaks in the envelope that exceed the at least one selected threshold, and otherwise outputting a second selected voltage potential to the power terminal of the power amplifier,
wherein the pre-distortion block is configured to adjust the transform function applied by the pre-distortion block as a function of the selected voltage potential output through the switch module.

11. The invention of claim 1, further comprising:
(a) a digital comparator, coupled to the envelope computation block, for determining the occurrence of peaks in the envelope that exceed at least one selected threshold; and
(b) a switch module, coupled to the digital comparator and to the power terminal of the power amplifier, and configured to be coupled to at least two voltage sources having different voltage potentials, for outputting a first selected voltage potential to the power terminal of the power amplifier in response to the determined occurrence of peaks in the envelope that exceed the at least one selected threshold, and otherwise outputting a second selected voltage potential to the power terminal of the power amplifier.

12. The invention of claim 1, further comprising a linearization block, coupled between the modulator and the combining and conversion circuitry, for linearizing the modulated information signal.

13. The invention of claim 12, further comprising a receiver circuit, coupled to the linearization block, for receiving from a remote gateway a calibration signal derived from signals transmitted by the telecommunications system transmitter circuit, wherein the linearization block is configured to adjust the amount of linearization applied by the linearization block as a function of the received calibration signal.

14. The invention of claim 1, further comprising a DC bias circuit, coupled directly or indirectly to the combining and conversion circuitry, for adding a selected amount of DC bias to the input signal to the input of the power amplifier.

15. The method of claim 1, wherein the dynamic input bias signal is essentially the envelope of the form of the source information signal.

16. The invention of claim 1, wherein the dynamic input bias signal is proportional to the envelope of the form of the source information signal.

17. A method for biasing a telecommunications system transmitter circuit, comprising:
(a) receiving digital source information;
(b) generating a modulated information signal from the received digital source information;
(c) generating an envelope of a form of the source information;
(d) digitally combining the modulated information signal and a dynamic input bias signal into a combined digital signal, wherein the dynamic input bias signal corresponds to the envelope of the form of the source information signal;
(e) converting the combined digital signal into an analog signal; and
(f) outputting the analog signal, the analog signal suitable to be applied to an input of a power amplifier.

18. The method of claim 17, further comprising coupling the analog signal to the input of a power amplifier, for amplification by the power amplifier.

19. The method of claim 17, further comprising applying a transform function to the envelope before generating the dynamic input bias signal, such that the dynamic input bias signal is a pre-distorted dynamic input bias signal.

20. The method of claim 19, wherein the transform function applies a first pre-distortion level for envelope levels below a selected threshold, and a second pre-distortion level, less than the first pre-distortion level, for envelope levels above the selected threshold.

21. The method of claim 19, wherein the transform function is applied only to envelope levels below a selected threshold.

22. The method of claim 19, wherein the transform function is an inverse profile of a gain profile of the power amplifier.

23. The method of claim 19, further comprising:
(a) receiving from a remote gateway a calibration signal derived from signals transmitted by the telecommunications system transmitter circuit; and
(b) adjusting the transform function as a function of the received calibration signal.

24. The method of claim 19, further comprising:
(a) determining the pending occurrence of peaks in the envelope;
(b) outputting a supply voltage for the power amplifier, the supply voltage having a voltage potential as a function of the determined occurrence of pending peaks in the envelope, and
(c) adjusting the transform function as a function of the supply voltage potential.

25. The method of claim 17, further comprising:
(a) determining the pending occurrence of peaks in the envelope; and
(b) outputting a supply voltage for the power amplifier, the supply voltage having a voltage potential as a function of the determined occurrence of pending peaks in the envelope.

26. The method of claim 19, further comprising:
(a) determining the occurrence of peaks in the envelope that exceed at least one selected threshold;
(b) outputting a first supply voltage to the power amplifier in response to the determined occurrence of peaks in the envelope that exceed the at least one selected threshold, and otherwise outputting a second supply voltage to the power amplifier; and (c) adjusting the transform function as a function of the supply voltage output.

27. The method of claim 17, further comprising:
(a) determining the occurrence of peaks in the envelope that exceed at least one selected threshold; and
(b) outputting a first selected supply voltage to the power amplifier in response to the determined occurrence of peaks in the envelope that exceed the at least one selected threshold, and otherwise outputting a second selected supply voltage to the power amplifier.

28. The method of claim 17, further comprising applying a linearizing transform function to the modulated information signal.

29. The method of claim 28, further comprising:
(a) receiving from a remote gateway a calibration signal derived from signals transmitted by the telecommunications system transmitter circuit; and
(b) adjusting the linearizing transform function as a function of the received calibration signal.

30. The method of claim 17, further comprising adding a selected amount of DC bias to the input of the power amplifier.

31. The method of claim 17, wherein the dynamic input bias signal is essentially the envelope of the form of the source information signal.

32. The method of claim 17, wherein the dynamic input bias signal is proportional to the envelope of the form of the source information signal.

* * * * *